United States Patent
Kasai et al.

(10) Patent No.: US 6,171,977 B1
(45) Date of Patent: *Jan. 9, 2001

(54) SEMICONDUCTOR DEVICE APPLIED TO COMPOSITE INSULATIVE FILM MANUFACTURING METHOD THEREOF

(75) Inventors: Yoshio Kasai, Yokohama; Takashi Suzuki, Yokkaichi; Takanori Tsuda, Kawasaki; Yuuichi Mikata, Yokohama; Hiroshi Akahori; Akihito Yamamoto, both of Yokkaichi, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/777,098

(22) Filed: Dec. 30, 1996

Related U.S. Application Data

(63) Continuation of application No. 08/450,656, filed on May 25, 1995, now abandoned.

(30) Foreign Application Priority Data

May 27, 1994 (JP) .................................................. 6-115293
May 19, 1995 (JP) .................................................. 7-121030

(51) Int. Cl.[7] .......................... H01L 21/31; H01L 21/469
(52) U.S. Cl. ............................ 438/775; 438/776; 438/791
(58) Field of Search .................................. 438/775, 776, 438/791

(56) References Cited

U.S. PATENT DOCUMENTS 4,277,320 * 7/1981 Beguwala et al. ................... 437/946
4,279,947 * 7/1981 Goldman et al. ................. 427/255.2

(List continued on next page.)

FOREIGN PATENT DOCUMENTS

| 0 266 268 | 4/1988 | (EP) . |
| 0 637 063 | 1/1995 | (EP) . |
| 54-023379 * | 7/1977 | (JP) ............................... H01L/21/31 |
| 53-33580 * | 3/1978 | (JP) ............................. H01L/21/314 |
| 57-54332 | 3/1982 | (JP) . |
| 63-87772 | 4/1988 | (JP) . |
| 6-29248 | 4/1994 | (JP) . |

OTHER PUBLICATIONS

Patent Abstracts of Japan, vol. 12, No. 324 (E–653), Sep. 02, 1988.

(List continued on next page.)

* cited by examiner

Primary Examiner—Charles Bowers
Assistant Examiner—Erik Kielin
(74) Attorney, Agent, or Firm—Finnegan, Henderson, Farabow, Garrett, & Dunner, L.L.P.

(57) ABSTRACT

A semiconductor wafer having an impurity diffusion layer formed in an inner surface of a trench is cleaned. The semiconductor wafer is inserted into a furnace, and $NH_3$ gas is introduced into the furnace in the low-pressure condition to create an atmosphere in which the temperature is set at 800° C. to 1200° C. and the partial pressures of $H_2O$ and $O_2$ are set at $1 \times 10^{-4}$ Torr or less. A natural oxide film formed on the inner surface of the trench is removed, and substantially at the same time, a thermal nitride film is formed on the impurity diffusion layer. Then, a CVD silicon nitride film is formed on the thermal nitride film without exposing the thermal nitride film to the outside air in the same furnace. Next, a silicon oxide film is formed on the CVD nitride film. As a result, a composite insulative film formed of the thermal nitride film, CVD silicon nitride film and silicon oxide film is obtained. Then, an electrode for the composite insulative film is formed in the trench.

15 Claims, 9 Drawing Sheets

U.S. PATENT DOCUMENTS

| | | | |
|---|---|---|---|
| 4,298,629 | | 11/1981 | Nozaki et al. . |
| 4,353,936 | | 10/1982 | Nozaki et al. . |
| 4,510,172 | * | 4/1985 | Ray ................................. 427/38 |
| 4,855,258 | * | 8/1989 | Allman et al. ................. 437/241 |
| 5,032,545 | * | 7/1991 | Doan et al. ..................... 437/242 |
| 5,067,218 | * | 11/1991 | Williams ......................... 29/25.01 |
| 5,242,847 | * | 9/1993 | Ozturk et al. .................. 437/41 |
| 5,376,223 | | 12/1994 | Salimian et al. . |
| 5,445,999 | * | 8/1995 | Thakur et al. .................. 438/775 |
| 5,464,792 | * | 11/1995 | Tseng et al. .................... 437/160 |
| 5,478,765 | * | 12/1995 | Kwong et al. .................. 437/40 |
| 5,538,340 | * | 7/1996 | Salzman .......................... 414/786 |
| 5,541,141 | * | 7/1996 | Cho .................................. 437/239 |
| 5,663,087 | * | 9/1997 | Yokozawa ....................... 438/791 |
| 5,899,752 | * | 5/1999 | Hey et al. ........................ 438/791 |

OTHER PUBLICATIONS

Patent Abstracts of Japan, vol. 6, No. 128 (E–118), Jul. 14, 1982.

Ito, Takashi et al, "Thermally Grown Silicon Nitride Films for High Performance MNS Devices", Appl. Phys. Lett. 32 (5) Mar. 1978.*

Wolf, Stanley, "Silicon Processing for the VLSI Era", vol. 1, Lattice Press, California (1986) pp. 516–517.*

Ghandi, Sorab, "VLSI Fabrication Principles–Silicon and Gallium Arsenide", John Wiley & Sons, New York, (1983) pp. 2–3.*

Wolf, Stanley, Silicon Processing for the VLSI Era, vol. 2, pp. 600–609, 1990.*

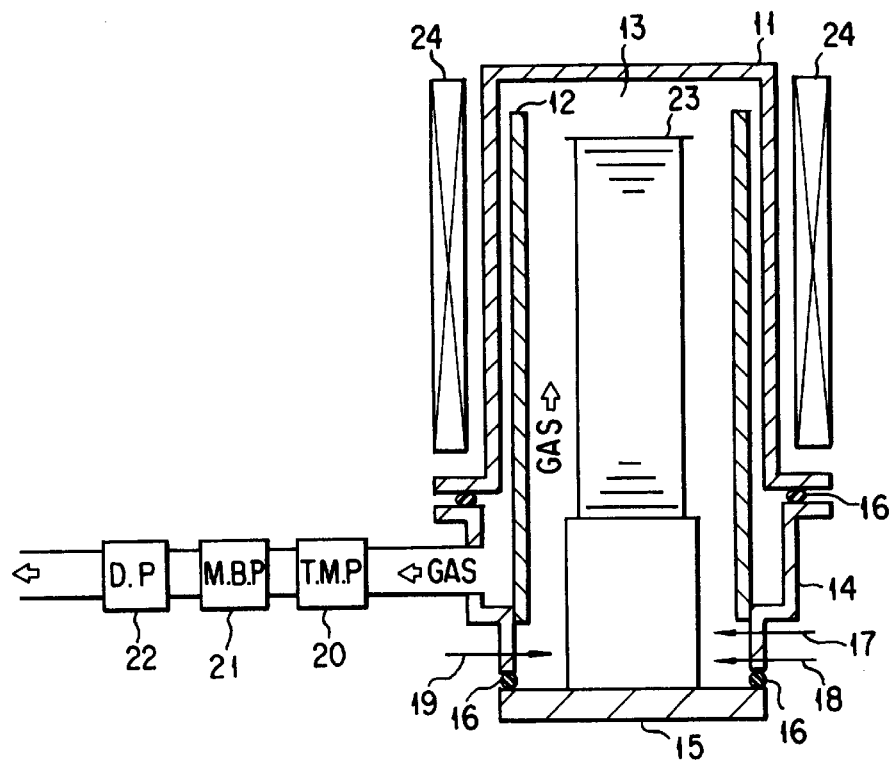
F I G. 1
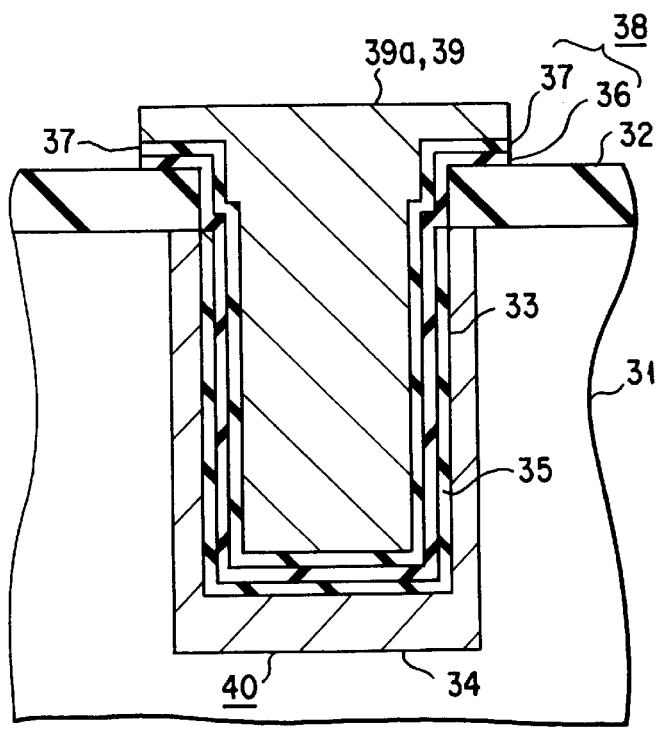
F I G. 3

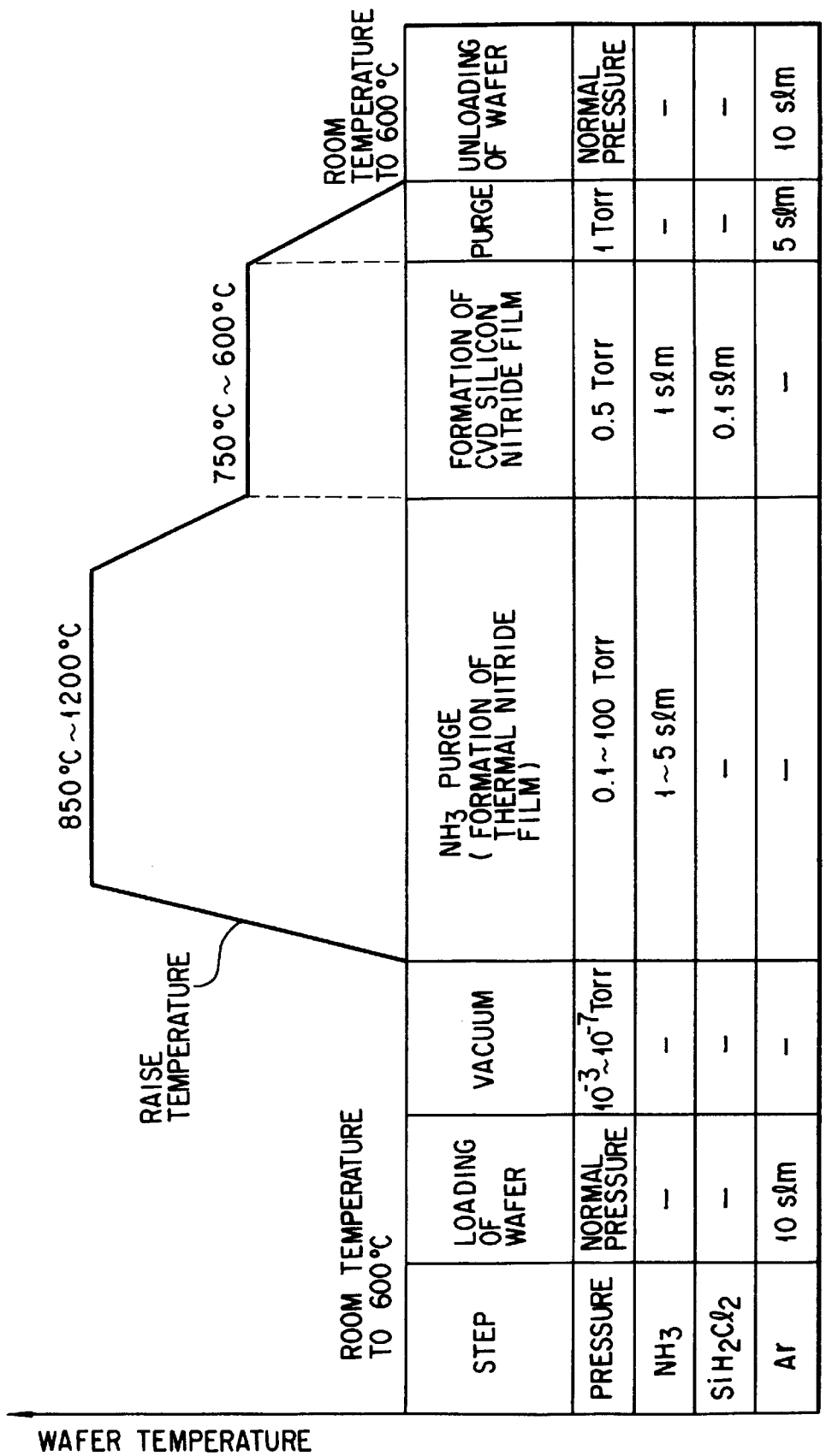
F I G. 2

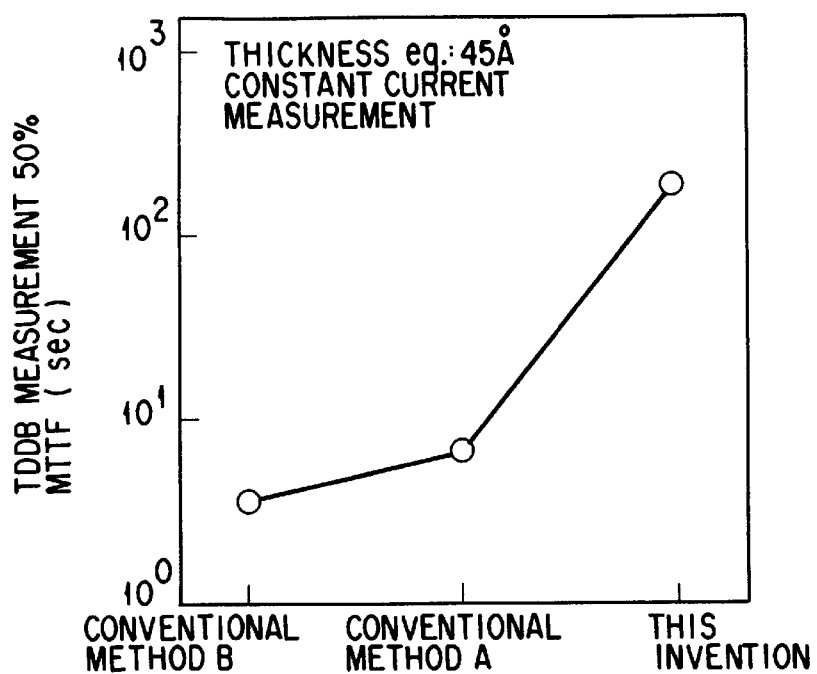
F I G. 15
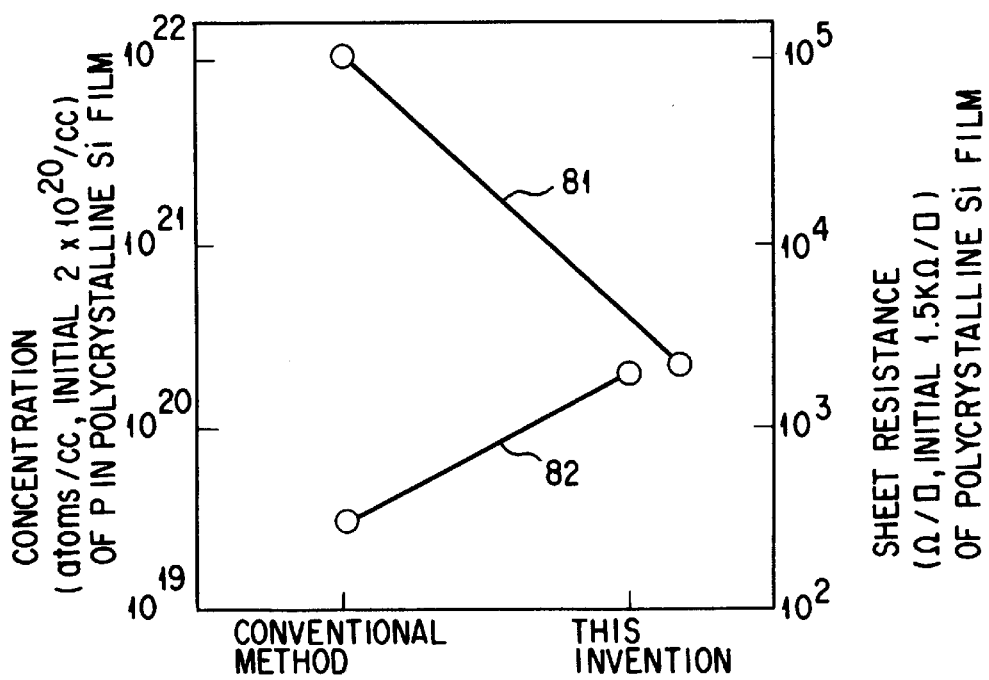
F I G. 16

SEMICONDUCTOR DEVICE APPLIED TO COMPOSITE INSULATIVE FILM MANUFACTURING METHOD THEREOF

This application is a continuation of Ser. No. 08/450,656, filed May 25, 1995, now abandoned.

BACKGROUND OF THE INVENTION

1. Field of the Invention

This invention relates to a semiconductor device and a manufacturing method thereof, and more particularly to formation of a composite insulative film by use of the CVD (Chemical Vapor Deposition) method.

2. Description of the Related Art

In a semiconductor integrated circuit, for example, an insulative film used for forming a capacitor of a memory cell is required to be made thin and have a large dielectric constant in order to stably provide a preset capacitance even when the size of the capacitor is reduced with an increase in the integration density. A silicon nitride film is known as an insulative film having a dielectric constant larger than that of a silicon oxide film.

FIG. 18 is a cross sectional view showing a semiconductor device manufactured by the conventional manufacturing method. An insulative film 2 is formed on the surface of a semiconductor wafer 1 and patterned. A trench 3 is formed in the semiconductor wafer 1 by etching the semiconductor wafer 1 with the insulative film 2 used as a mask. Next, a single crystal Si layer doped with impurity, that is, an impurity layer 4 is formed on the inner surface of the trench 3. After this, the semiconductor wafer 1 is subjected to the cleaning process by use of chemicals.

Next, the semiconductor wafer 1 is loaded into a furnace (not shown). In the furnace, a CVD silicon nitride film 6 is deposited on the inner surface of the trench 3 and the insulative film 2 by the LPCVD (Low Pressure Chemical Vapor Deposition) method. Next, a silicon oxide film 7 is formed on the silicon nitride film 6. As a result, a composite insulative film 9 formed of the silicon nitride film 6 and silicon oxide film 7 is formed in the trench 3. After this, a polysilicon film 8a doped with impurity is deposited on the silicon oxide film 7. The internal portion of the trench 3 is filled with the polysilicon film 8a. Next, the polysilicon film 8a, silicon oxide film 7 and silicon nitride film 6 are patterned to form an electrode 8 of the polysilicon film 8a in the trench 3. Therefore, a capacitor 10 is constructed by the electrode 10, the composite insulative film 9 and the insulative diffusion layer 4 used as an electrode in the trench 3.

When the silicon nitride film 6 is formed on the inner surface of the trench 3 in the furnace, a natural oxide film 5 with a thickness of approx. 1 nm to 2 nm is formed between the silicon nitride film 6 and the impurity diffusion layer 4. Therefore, the actual composite insulative film 9 is formed of the natural oxide film 5, silicon oxide film 7 and silicon nitride film 6. As the cause of formation of the natural oxide film, the following three causes are considered. The first cause is based on dissolved oxygen in the cleaning liquid in the cleaning process, the second cause is based on oxygen in the atmosphere, and the third cause is based on oxygen contained in the outside air introduced into the silicon nitride film forming furnace when the wafer 1 is carried into the furnace.

Thus, if the natural oxide film 5 with a thickness of approx. 1 nm to 2 nm is formed between the silicon nitride film 6 and the impurity diffusion layer 4, the film thickness of the capacitor insulative film is increased by 1 nm to 2 nm, thereby preventing the film thickness of the capacitor insulative film from being reduced. Further, if the natural oxide film is formed, the film quality of the capacitor insulative film is deteriorated, thereby lowering the dielectric strength and degrading the reliability of the insulative film.

As a method of solving the above problems, a method of removing the natural oxide film 5 in the trench 3 by forming an atmosphere in which the partial pressures of $H_2O$ and $O_2$ are set equal to or lower than $1 \times 10^{-4}$ Torr in the furnace used for the LPCVD method, processing the semiconductor wafer 1 in the atmosphere, and then forming the CVD silicon nitride film 6 is considered.

Further, a method of reducing the natural oxide film 5 by introducing a reducing gas such as $H_2$, $SiH_4$, $Si_2H_6$, and HCl into the furnace used for the LPCVD and then forming a thermal nitride film is considered.

However, according to the above two methods, after the natural oxide film 5 on the inner wall of the trench is removed in the furnace, the clean inner surface of the trench 3 is exposed to the high-temperature and low-pressure atmosphere so that impurity in the impurity diffusion layer 4 will be diffused towards the outside and extracted. As a result, if a composite insulative film formed by the above method is used for the capacitor insulative film of the memory cell and when an electric field is applied to the capacitor insulative film, the interface area between the capacitor insulative film and the impurity diffusion layer is depleted, thereby causing a problem that an effective storage amount of charges cannot be obtained.

Further, according to the above two methods, since the clean inner surface of the trench 3 is exposed to the high-temperature and low-pressure atmosphere after the natural oxide film 5 in the trench is removed in the furnace, etching pits may be formed in the inner surface of the trench by an oxidation gas such as $H_2O$ or $O_2$ in some cases. In addition, SiC may be sometimes formed on the inner surface of the trench by a carbonaceous gas such as CO, $CO_2$ and hydro-carbon gas. Therefore, if a composite insulative film formed by the above methods is used for the capacitor insulative film of the memory cell, a problem that the dielectric strength and the reliability of the capacitor insulative film are lowered occurs.

SUMMARY OF THE INVENTION

An object of this invention is to provide a semiconductor device which is high in the dielectric strength, can prevent degradation in the reliability, can be made thin and is suitable for a composite insulative film, and a method of manufacturing the same.

The above object can be attained by a semiconductor device comprising a semiconductor layer; and a thermal nitride film formed directly on the semiconductor layer, the concentration of oxygen contained in the thermal nitride film being not higher than $1.36 \times 10^{15}$ (atoms/$cm^2$).

Further, the above object can be attained by a semiconductor device manufacturing method comprising a first step of removing a natural oxide film on a semiconductor layer, and substantially at the same time, forming a thermal nitride film on the semiconductor layer; and a second step of forming a nitride film on the thermal nitride film by the CVD method.

According to the semiconductor device of this invention, the thermal nitride film is formed directly on the semiconductor layer and the concentration of oxygen in the thermal nitride film is set to be not higher than $1.36 \times 10^{15}$ (atoms/ cm$^2$). Therefore, the flatness of a silicon nitride film formed on the thermal nitride film can be enhanced and the dielectric strength can be prevented from being lowered. In addition, since no natural oxide film is formed between the thermal nitride film and the silicon nitride film, the film thickness can be made small.

According to the semiconductor device manufacturing method of this invention, the thermal nitride film is formed on the semiconductor layer substantially at the same time that the natural oxide film formed on the substrate is removed. Therefore, the concentration of oxygen contained in the thermal nitride film can be set extremely low. Thus, since a silicon nitride film excellent in the flatness can be formed on the thermal nitride film, the dielectric strength and reliability can be prevented from being lowered and the film thickness can be made small. Further, the natural oxide film on the semiconductor layer can be unfailingly removed by setting the partial pressures of H$_2$O and O$_2$ to be values shown in equation (1) to be described later. Further, the thermal nitride film can be formed on the surface of the semiconductor layer at the same time as elimination of the natural oxide film by introducing ammonia gas of low pressure. After this, a natural oxide film can be prevented from being formed between the thermal nitride film and the silicon nitride film by forming the silicon nitride film following on the formation of the thermal nitride film. The insulative film thus formed is high in the insulation dielectric strength and excellent in the reliability and can be formed thin.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a construction view showing a high-vacuum LPCVD device used for manufacturing a semiconductor device by the manufacturing method of a first or second embodiment of this invention;

FIG. 2 is a diagram showing the sequence of the semiconductor device manufacturing method according to the first or second embodiment of this invention;

FIG. 3 is a cross sectional view showing a semiconductor device manufactured by a manufacturing method according to the first embodiment of this invention;

FIG. 15 is a graph showing the results of TDDB measurements of the semiconductor devices manufactured by the manufacturing method of this invention and the conventional manufacturing method;

FIG. 16 is a graph showing the sheet resistance of the polysilicon film and the impurity concentration of the polysilicon film of the semiconductor devices manufactured by the manufacturing method of this invention and the conventional manufacturing method;

DETAILED DESCRIPTION OF THE PREFERRED EMBODIMENTS

Figure 4:
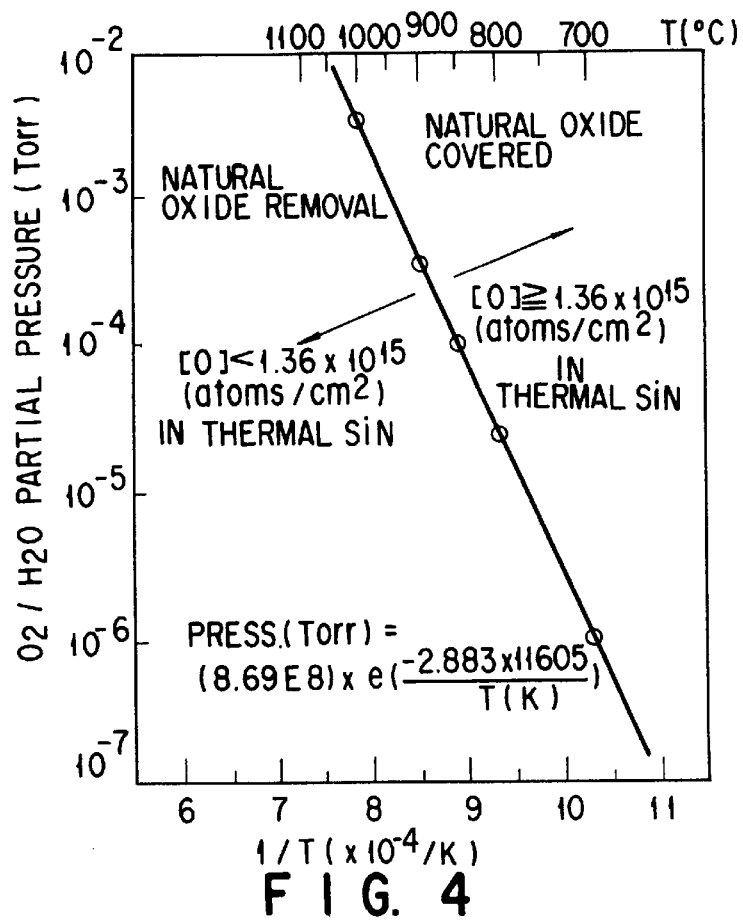
FIG. 4 is a graph showing the relation between the partial pressures of H$_2$O and O$_2$ in the processing chamber and the temperature.

There will now be described an embodiment of this invention with reference to the accompanying drawings.

FIG. 1 shows a high-vacuum LPCVD device used for manufacturing a semiconductor device by the manufacturing method of a first or second embodiment of this invention. An inner tube 12 formed of quartz is disposed inside an outer tube 11 which is formed of quartz and is closed at one end and the internal space of the inner tube 12 is used as a processing chamber 13. The outer tube 11 and inner tube 12 of the double-tube structure are supported by a SUS-made manifold 14 and one end of the manifold 14 and the other end of the outer tube 11 are hermetically sealed by an O-ring 16 or metal seal. A heater 24 for heating the internal portion of the processing chamber 13 is disposed outside the outer tube 11.

An SUS-made capping flange 15 is mounted on the other end of the manifold 14 and the capping flange 15 and the other end of the manifold 14 are connected together by an O-ring 16 or metal seal. Thus, the processing chamber 13 is hermetically sealed. A quartz boat 23 which can carry a plurality of semiconductor wafers is disposed on the capping flange 15 in the processing chamber 13.

An NH$_3$ gas introducing nozzle 17, SiH$_2$Cl$_2$ gas introducing nozzle 18 and inert gas introducing nozzle 19 for introducing NH$_3$ gas, SiH$_2$Cl$_2$ gas and inert gas such as N$_2$ and Ar into the processing chamber 13 are formed in the manifold 14. In FIG. 1, each of the nozzles is simply shown by an arrow. Further, a turbo-molecular pump (T.M.P) 20 for exhausting an internal gas in the processing chamber is connected to the manifold 14. A mechanical booster pump (M.B.P) 21 is connected to the turbo-molecular pump 20 and a dry pump (D.P) 22 is connected to the mechanical booster pump (M.B.P) 21.

FIG. 2 shows the sequence of the semiconductor device manufacturing method according to the first or second embodiment of this invention. FIG. 3 is a cross sectional view showing a semiconductor device on which a composite insulative film constructed by three insulative films including a CVD silicon nitride film is formed as a capacitor insulative film of the memory cell. Next, a semiconductor device manufacturing method according to the first embodiment of this invention is explained with reference to FIGS. 1 to 3.

First, as shown in FIG. 3, an insulative film 32 is formed on the surface of a semiconductor wafer 31 and selectively patterned. A trench 33 is formed in the semiconductor wafer 31 by etching the semiconductor wafer 31 with the insulative film 32 used as a mask so as to expose single crystal Si on the inner surface of the trench 33. Next, impurity is doped into the exposed single crystal Si and a single crystal Si layer doped with impurity, that is, an impurity diffusion layer 34 is formed in the inner surface area of the trench 33. The impurity diffusion layer 34 is used as an electrode of the capacitor. After this, the semiconductor wafer 1 is subjected to the cleaning process by use of chemicals (not shown). Specifically, the cleaning process for removing impurities is effected by dipping the wafer 31 into a solution containing hydrochloric acid and hydrogen peroxide solution, for example. At the time of or after the cleaning process, a natural oxide film (not shown) is formed on the inner surface of the trench 33.

Next, the semiconductor wafer 31 is processed according to the sequence shown in FIG. 2. That is, the semiconductor wafer 1 is placed on a quartz boat 23 and the quartz boat 23 is loaded into a processing chamber 13 of the high-vacuum LPCVD device of FIG. 1 in which the temperature is set in a low temperature range from the room temperature to approx. 600° C. At this time, a natural oxide film (not shown) with a thickness of approx. 1 nm to 2 nm is formed on the inner surface of the trench 33. When the quartz boat 23 is carried into the processing chamber 13, Ar gas is introduced into the processing chamber 13 at the flow rate of 10 slm from the nozzle 19. After this, the inert gas in the processing chamber 13 is discharged by the dry pump 22, mechanical booster pump 21 and turbo molecular pump 20 to lower the pressure in the processing chamber 13 to $10^{-3}$ Torr or less. At this time, the partial pressures of $H_2O$ and $O_2$ are set to $1\times10^{-4}$ Torr or less. It is difficult to independently set the partial pressures of $H_2O$ and $O_2$, and therefore, the partial pressure of $H_2O$ may be set to $1\times10^{-4}$ Torr or less for convenience, for example.

After this, $NH_3$ gas is introduced into the processing chamber 13 at the flow rate of 1 to 5 slm from the nozzle 17 and the pressure is controlled to form a low-pressure atmosphere of 0.1 to 100 Torr in the processing chamber 13. Next, the $NH_3$ gas is introduced into the processing chamber 13 and the semiconductor wafer 31 is heated by the heater 24 to set the temperature thereof to, for example, 800° C. to 1200° C. with the low-pressure atmosphere kept unchanged. In this state, the semiconductor wafer 31 is kept at the temperature of 800° C. to 1200° C. for approx. 0 to 120 min. As a result, the natural oxide film formed on the inner surface of the trench 33 is vaporized and eliminated, and at the same time, a thermal nitride film with a thickness of 2 nm to 5 nm is formed on the inner surface of the trench 33.

The reason why the natural oxide film in the trench 33 can be removed is that the partial pressures of $H_2O$ and $O_2$ are set to $1\times10^{-4}$ Torr or less. Further, the reason why the thermal nitride film 35 is formed on the inner surface of the trench 33 is that the $NH_3$ gas is introduced into the processing chamber 13 with the temperature of the wafer 31 kept at 800° C. to 1200° C.

FIG. 4 is a graph showing the relation between the partial pressures of $H_2O$ and $O_2$ in the processing chamber and the temperature. In a state in which the wafer temperature is kept at 850° C. or more and the partial pressures of $H_2O$ and $O_2$ in the processing chamber are set equal to or lower than approx. $10^{-4}$ Torr, the concentration of oxygen in the thermal nitride film becomes less than $1.36\times10^{15}$ atoms/cm$^2$ (less than that of an oxygen monoatomic layer) and it is understood that the natural oxide film has been removed.

Since the concentration of oxygen of the oxygen monoatomic layer formed on the silicon layer is $1.36\times10^{15}$ atoms/cm$^2$, the concentration of oxygen of the natural oxide film formed on the silicon layer is at least more than the above value. Generally, in the case where the thermal nitride film is formed on the silicon oxide film, the formed thermal nitride film takes in oxygen of the silicon oxide film. Due to this, the concentration of oxygen of the nitride film thermally formed without removing the natural oxide film is at least $1.36\times10^{15}$ atoms/cm$^2$ or more. Therefore, in the case where the concentration of oxygen of the thermal nitride film formed on the silicon layer is less than $1.36\times10^{15}$ atoms/cm$^2$, the natural oxide film is removed to form the thermal nitride film.

The partial pressures of $H_2O$ and $O_2$ to the temperature of the characteristics of FIG. 4 can be expressed by the following equation (1):

$$Pr = S \times e^{(E \cdot C/T)} \text{ (Torr)} \tag{1}$$

where S: inclination ($1\times10^8$ to $1\times10^9$), E: active energy (−2.5 to −3.5), C: coefficient for transferring Joule/mol to ev (11605), and T: absolute temperature.

The partial pressures of $H_2O$ and $O_2$ are set to less than Pr obtained by the above equation (1), thereby the natural oxide film on the semiconductor layer can be removed without fail. The straight line shown in FIG. 4 indicates a case of $S=8.69\times10^8$ and $E=-2.883$ in equation (1). In FIG. 4, an optimum temperature condition of processing is 800 to 900° C., and the partial pressures $H_2O$ and $O_2$ are substantially $2.5\times10^{-5}$ to $3.5\times10^{-4}$ Torr.

$NH_3$ gas is introduced into the processing chamber 13 when the temperature of the semiconductor wafer 31 is raised. Therefore, impurity will not be extracted from the impurity diffusion layer 34.

Next, the temperature of the wafer is lowered to 750° C. to 600° C. while $NH_3$ is being continuously introduced with the internal space of the processing chamber 13 kept in the low-pressure atmosphere. After this, $SiH_2Cl_2$ gas is introduced into the processing chamber 13 from the nozzle 18 at the flow rate of 0.1 slm and the flow rate of $NH_3$ introduced from the nozzle 17 is set to 1 slm to adjust the internal pressure of the processing chamber 13 to 0.5 Torr. Thus, as shown in FIG. 3, a CVD silicon nitride film (which is hereinafter referred to as CVD-SiN film) is formed on the thermal nitride film 35 and insulative film 32.

After this, the temperature of the semiconductor wafer 31 is lowered to the room temperature to approx. 600° C. At this time, introduction of $SiH_2Cl_2$ gas and $NH_3$ gas into the processing chamber 13 is interrupted and Ar gas is introduced into the processing chamber 13 from the nozzle 19 at the flow rate of approx. 5 slm. At this time, the pressure in the processing chamber 13 is adjusted to approx. 1 Torr.

Next, after gases in the processing chamber 13 are replaced by Ar gas, the semiconductor wafer 31 is taken out from the processing chamber 13.

After this, the semiconductor wafer 31 is carried into a furnace different from the LPCVD device shown in FIG. 1, and as shown in FIG. 3, a silicon oxide film 37 (CVD silicon oxide film or thermal silicon oxide film) with a thickness of approx. 1 nm to 2 nm is formed on the CVD-SiN film 36. As a result, a composite insulative film 38 of three-layered structure formed of the silicon oxide film 37, CVD-SiN film 36 and thermal nitride film 35 is formed. Next, a polysilicon film 39a doped with impurity is deposited on the composite insulative film 38 and patterned together with the composite insulative film 38. Thus, an electrode 39 formed of the polysilicon film 39a is disposed in the trench 33. Therefore, in the trench 33, a capacitor 40 is constructed by the electrode 39, composite insulative film 38 and impurity diffusion layer 34.

According to the first embodiment, the partial pressures of $H_2O$ and $O_2$ in the processing chamber are set to be lower than the condition shown in equation (1), and the wafer 31 is processed in an atmosphere created by introducing $NH_3$ gas at the flow rate of 1 to 5 slm into the processing chamber 13. As a result, the natural oxide film on the inner surface of the trench 33 can be removed, and at the same time, the thermal nitride film 35 with a thickness of approx. 2 nm to 5 nm can be formed. Therefore, a natural oxide film will not be formed between the impurity diffusion layer 34 and the CVD-SiN film 36, thereby preventing the electrical characteristic of the composite insulative film 38 from being lowered and making it possible to form a thin film.

Also, the flatness of the surface of the natural oxide film is considerably bad. In the case that the nitride film is conventionally formed on the surface of the natural oxide film, the flatness of the surface naturally worsens. In such a bad flatness condition, electrical field concentrates on the thin portion of the nitride film, and leak current to cause the generation of leak current. Due to this, it is needed that the nitride film be formed thick. However, in the present invention, since the thermal nitride film is directly formed on the silicon layer, good flatness can be obtained. As a result, the generation of leak current can be prevented, and the thermal nitride film can be formed thin. Moreover, since the thermal nitride film is directly formed on the silicon layer, no oxide film exists in the film, and the quality of the film can be stabilized. Therefore, the removal of the natural oxide film and the formation of the thermal nitride film 35 are performed at the same time, so that the thermal nitride film 35 can be thinned and prevented from being deteriorated at the same time.

Further, the concentration of oxygen in the surface of the thermal nitride film 35 can be lowered by forming the thermal nitride film 35 at the same time as elimination of the natural oxide film on the inner surface of the trench 33 and then forming the CVD-SiN film 36 on the thermal nitride film 35. Therefore, the formation delay time at the time of formation of the CVD-SiN film 36, that is, the incubation time can be reduced to zero. As a result, the morphology of the CVD-SiN film 36 can be made excellent and the roughness thereof becomes small, thereby enhancing the flatness of the surface thereof. Therefore, the leak current of the CVD-SiN film 36 becomes small and the dielectric strength can be prevented from being lowered.

Further, at the time of raise of the temperature of the semiconductor wafer 31, and at the time of elimination of the natural oxide film on the inner surface of the trench 33 and formation of the thermal nitride film 35, $NH_3$ gas is introduced into processing chamber 13 and the above processes are continuously effected. Therefore, unlike the conventional technique in which the thermal nitride film is formed after the natural oxide film in the trench is removed, impurity in the impurity diffusion layer is not extracted and occurrence of etching pits can be prevented.

Next, the above effect is explained in detail.

Figures 5A, 5C:
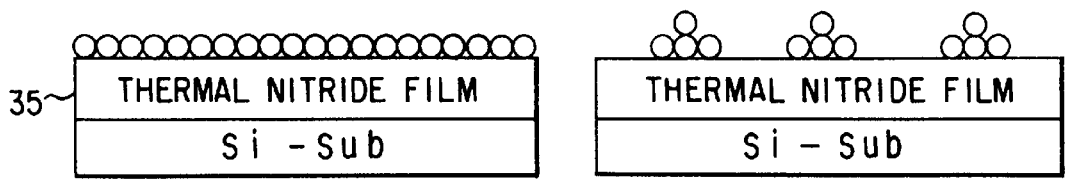
FIGS. 5A and 5B are diagrams for illustrating the CVD-SIN film and incubation time relating to the semiconductor device manufacturing method of this invention.
FIGS. 5C, 5D are diagrams for illustrating the CVD-SiN film and incubation time relating to the conventional semiconductor device manufacturing method.

In a case where the natural oxide film on the inner surface of the trench 33 (semiconductor wafer) is removed, and at the same time, the thermal nitride film 35 is formed on the inner surface of the trench 33, and then the CVD-SiN film 36 is continuously formed on the thermal nitride film 35, the concentration of oxygen in the thermal nitride film 35 can be kept at approx. $0.8 \times 10^{15}$ (atoms/cm$^2$) which is smaller than $1.36 \times 10^{15}$ (atoms/cm$^2$). Thus, if the concentration of oxygen in the thermal nitride film 35 is low and when the CVD-SiN film 36 is formed on the thermal nitride film 35, the incubation time can be reduced to zero. Therefore, as shown in FIG. 5A, nucleus can be uniformly formed when the CVD-SiN film 36 is formed on the surface of the thermal nitride film.

On the other hand, in a case where the natural oxide film on the inner surface of the trench is not sufficiently eliminated, and the processes for forming the thermal nitride film and the CVD-SiN film are discontinuously effected like the conventional case, the concentration of oxygen in the thermal nitride film is set higher than $1.36 \times 10^{15}$ (atoms/cm$^2$). Therefore, the incubation time cannot be set to zero when the CVD-SiN film is formed on the thermal nitride film, and as shown in FIG. 5C, non-uniform nucleus are formed on the surface of the thermal nitride film.

Figure 6:
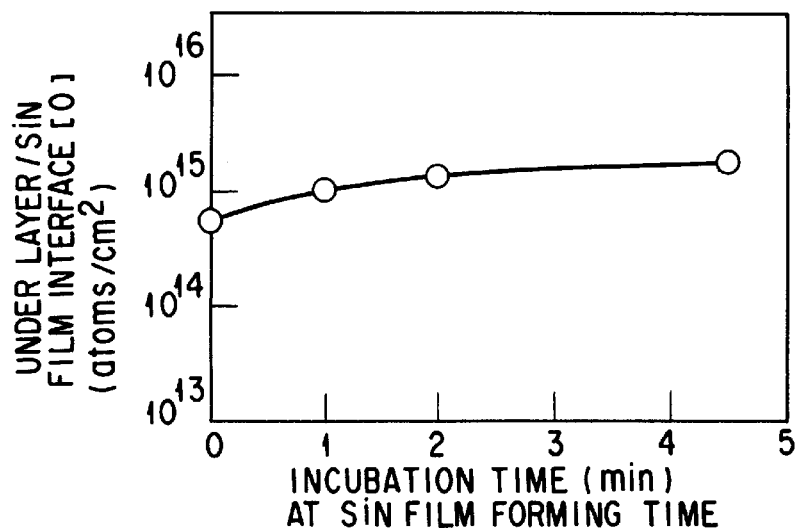
FIG. 6 is a graph showing the relation between the incubation time and the concentration of oxygen contained in the ground layer when the CVD-SiN film is formed.

FIG. 6 is a graph showing the relation between the incubation time and the concentration of oxygen contained in the ground film when the CVD-SiN film is formed. FIG. 6 indicates the results obtained by measuring the concentration of oxygen contained on the thermal nitride film by SIMS (Secondary Ion Mass Spectrometry) after forming the CVD-SiN film on the thermal nitride film on the silicon substrate with different incubation time. It is understood from FIG. 6 that the incubation time is set to zero when the concentration of oxygen in the ground layer is set equal to or lower than $1 \times 10^{15}$ (atoms/cm$^2$).

Figure 7:
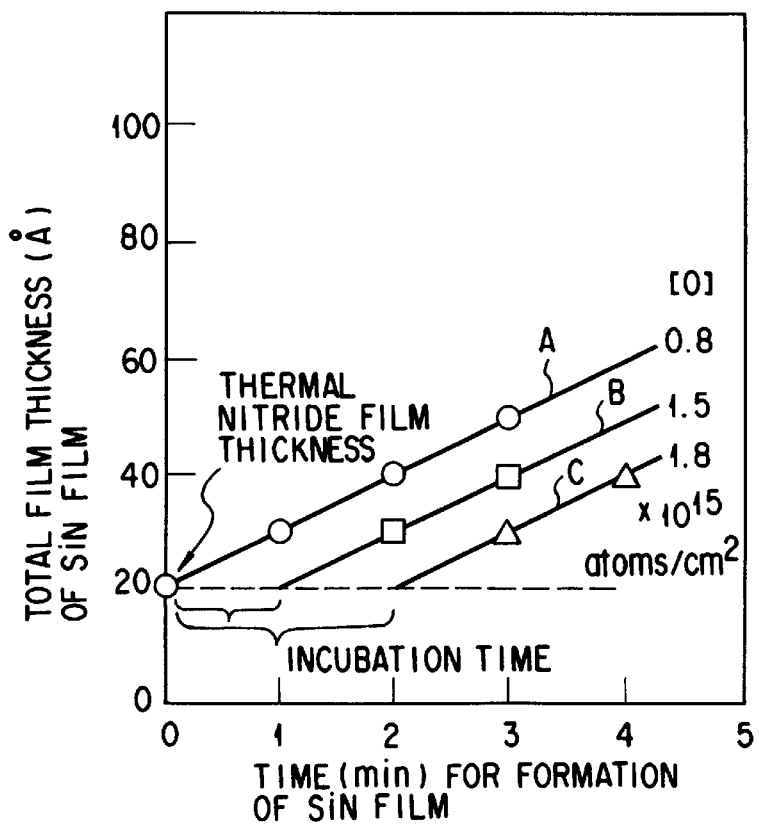
FIG. 7 is a graph showing the relation between time for forming the CVD-SiN film and the total film thickness of the thermal nitride film and the CVD-SiN film.

FIG. 7 shows the relation between time for formation of the CVD-SiN film formed on the thermal nitride film with a film thickness of 20 angstrom and the total film thickness of the thermal nitride film and the CVD-SiN film. In this example, the line A indicates a case wherein the thermal nitride film and the CVD-SiN film are continuously formed and the concentration of oxygen contained in the thermal nitride film is $0.8 \times 10^{15}$ (atoms/cm$^2$), the line B indicates a case wherein the thermal nitride film and the CVD-SiN film are continuously formed and the concentration of oxygen contained in the thermal nitride film is $1.5 \times 10^{15}$ (atoms/cm$^2$), and the line C indicates a case wherein the thermal nitride film and the CVD-SiN film are discontinuously formed, the surface of the thermal nitride film is oxidized, and the concentration of oxygen contained in the thermal nitride film is $1.8 \times 10^{15}$ (atoms/cm$^2$). It is clearly understood from FIG. 7 that as the concentration of oxygen in the thermal nitride film becomes higher, delay of the film formation is generated, the incubation time becomes longer and the total film thickness is made smaller if the film formation time is the same. As mentioned above, in the case where the concentration of oxygen contained in the thermal nitride film is high and the thermal nitride film and the CVD-SiN film are discontinuously formed, incubation time for several minutes is generated.

Figures 5B, 5D:
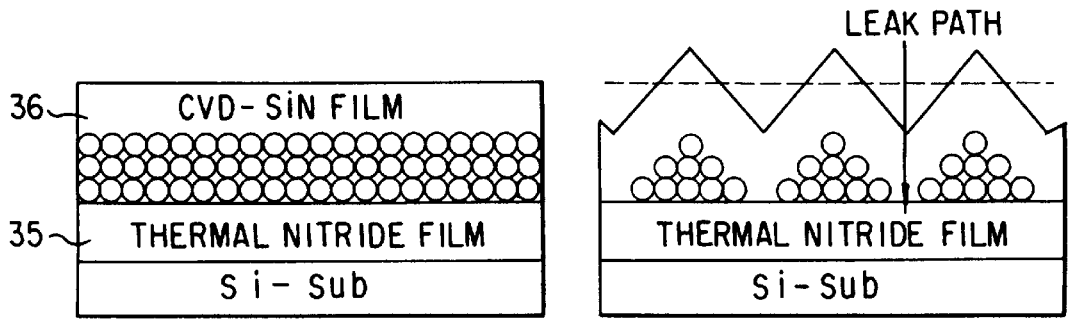
Figure 8:
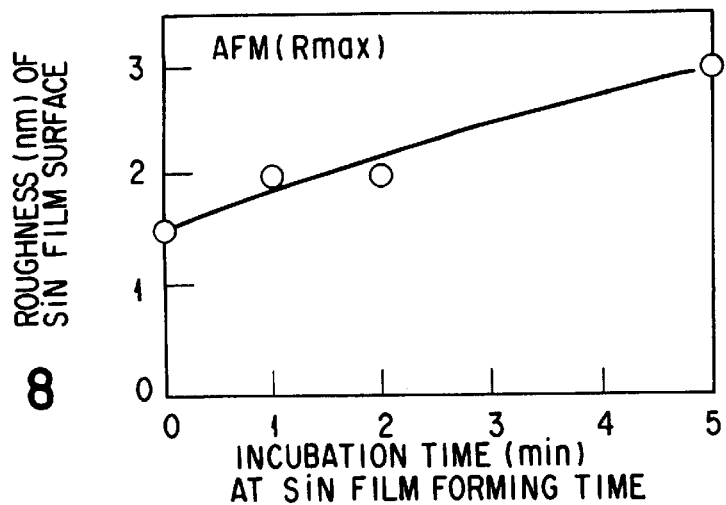
FIG. 8 is a graph showing the relation between the incubation time at the time of formation of the CVD-SiN film and the roughness of the surface of the CVD-SiN film formed.

FIG. 8 shows the relation between the incubation time at the time of formation of the CVD-SiN film and the roughness of the surface of the CVD-SiN film formed. FIG. 8 shows the result of measurement of the film formed in the same manner as in the case of FIG. 6 by AFM. It is clearly understood from FIG. 8 that the roughness becomes larger as the incubation time becomes longer. That is, if the incubation time is zero, the CVD-SiN film is formed with the uniform film thickness as shown in FIG. 5B. Therefore, the surface of the CVD-SiN film is made flat. However, if the incubation time is long, the film thickness of the CVD-SiN film becomes non-uniform as shown in FIG. 5D and it is considered that the roughness of the surface of the CVD-SiN film becomes larger. If the roughness of the surface of the CVD-SiN film thus becomes larger, a leak path is formed in a portion with a small film thickness and the dielectric strength is degraded.

Figure 9:
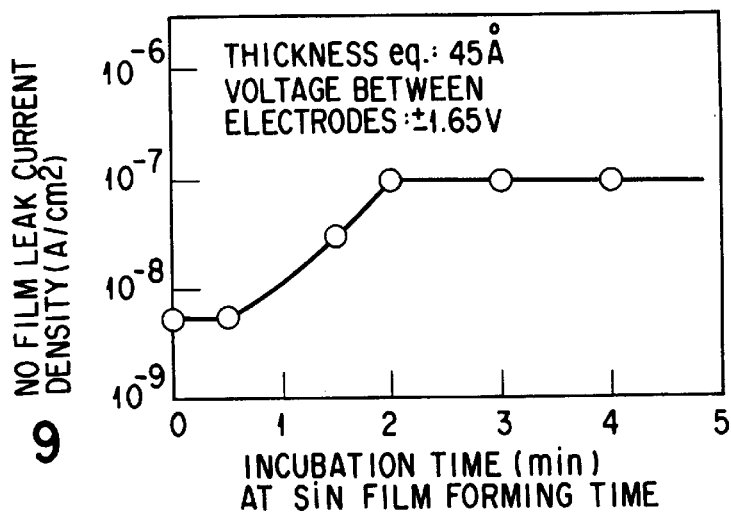
FIG. 9 is a graph showing the relation between the incubation time and the leak current density of the NO film.
Figure 10:
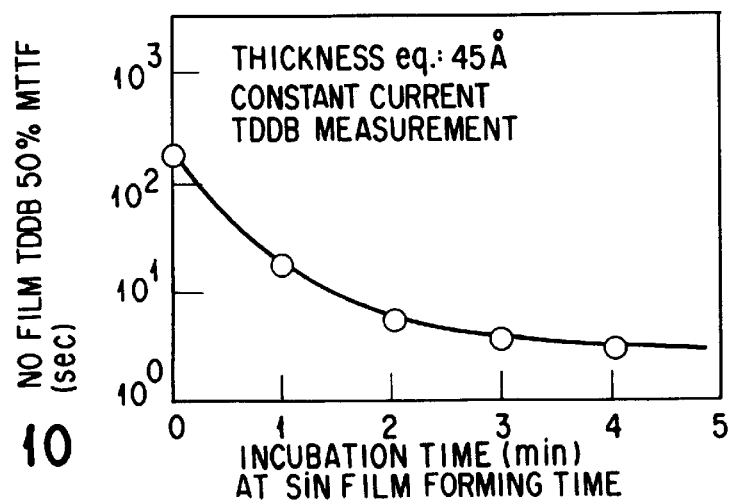
FIG. 10 is a graph showing the relation between the incubation time and the genuine breakdown of the NO film.
Figure 11:
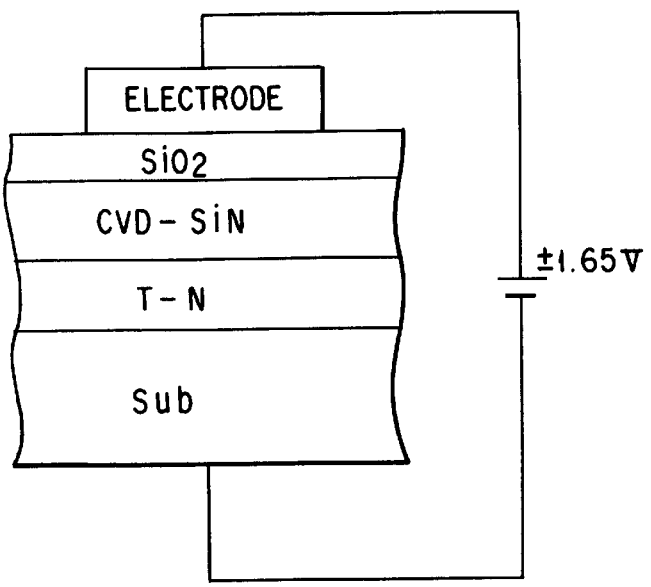
FIG. 11 is a view showing the structure of a sample used for FIGS. 9 and 10.

FIG. 9 shows the relation between the incubation time and the leak current density of the NO film, and FIG. 10 shows the relation between the incubation time and the dielectric breakdown of the NO film. In the case of FIGS. 9 and 10, a composite film with a structure shown in FIG. 11 and formed with different incubation time is used. FIG. 9 shows the result of measurement of the leak current density obtained when a voltage of ±1.65 V is applied between the semiconductor wafer and the $SiO_2$ film as shown in FIG. 11. FIG. 10 shows 50% MTTF (Mean Time To Failure) of the TDDB (Time Dependent Dielectric Breakdown) measurement by use of a constant current. 50% MTTF is the mean time until 50% of the measured samples are destroyed. In FIGS. 9 and 10, the thickness of the composite insulative film is expressed in terms of the film thickness of the oxide film (the film thickness equivalent to the film thickness of the oxide film; thickness eq.) and is 45 angstrom in this example. As is clearly understood from FIGS. 9 and 10, the leak current density is lower and the dielectric strength becomes larger as the incubation time is shorter.

Figure 12:
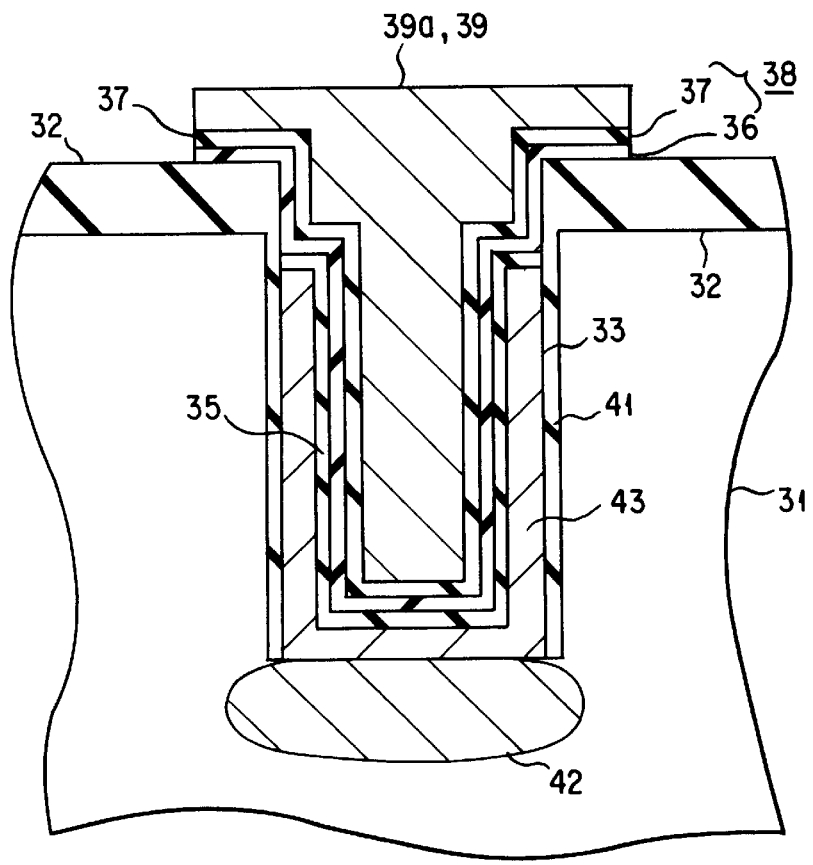
FIG. 12 is a cross sectional view showing a semiconductor device manufactured by a manufacturing method according to the second embodiment of this invention.

FIG. 12 is a cross sectional view showing another semiconductor device on which a composite insulative film formed of three-layered insulative film including a CVD-SiN film is formed as a capacitor insulative film of the memory cell and portions which are the same as those of FIG. 3 are denoted by the same reference numerals. Next, a semiconductor device manufacturing method according to the second embodiment of this invention is explained with reference to FIGS. 1, 2 and 5. Portions which are the same as those of the first embodiment are denoted by the same reference numerals and the explanation therefor is omitted.

As shown in FIG. 12, an oxide film 41 is formed on the inner side surface of the trench 33 of the semiconductor wafer 31. After this, a single crystal Si film doped with impurity, that is, impurity diffusion layer 42 is formed on the bottom surface of the trench 33. Next, a polysilicon film 43 is formed on the inner side surface and bottom surface of the trench 33 and impurity is doped into the polysilicon film 43. After this, the semiconductor wafer 31 is subjected to the cleaning process. At this time, a natural oxide film (not shown) is formed on the surface of the polysilicon film 43.

Next, the semiconductor wafer 31 is processed according to the sequence shown in FIG. 2. That is, a thermal nitride film 35 is formed on the polysilicon film 43 in the furnace shown in FIG. 1. A CVD-SiN film 36 and silicon oxide film 37 are formed on the thermal nitride film 35. After this, a polysilicon film 39a doped with impurity is deposited on a composite insulative film 38 and an electrode 39 is formed inside the trench 33. Therefore, a capacitor 40 is formed of the electrode 39, composite insulative film 38 and polysilicon film 43 in the trench 33.

The same effect obtained in the first embodiment can be attained in the second embodiment.

Figure 13:
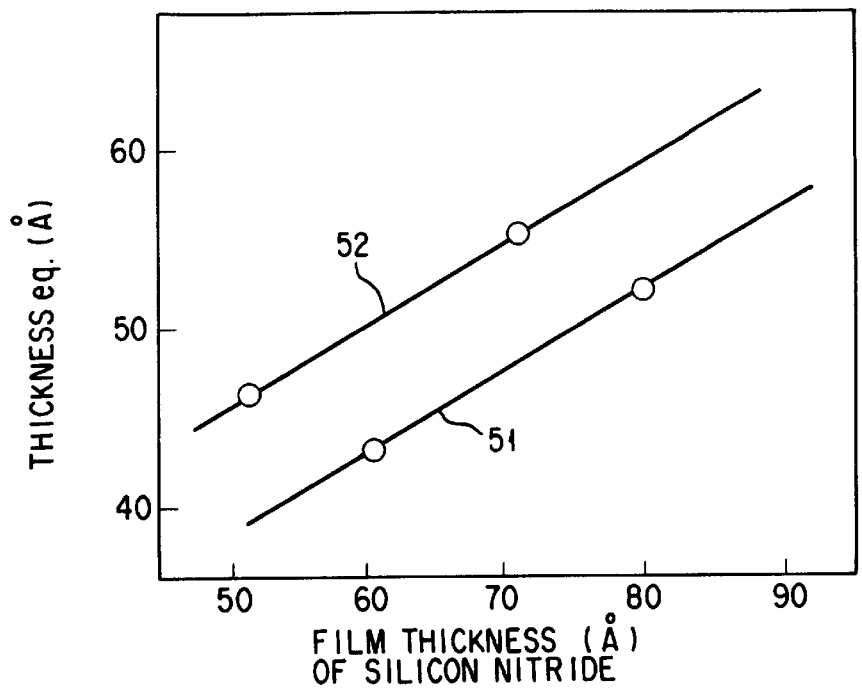
FIG. 13 is a graph showing the relation between the film thickness of the silicon nitride film and the film thickness expressed in terms of the film thickness of the oxide film.

FIG. 13 is a graph showing the relation between the film thickness of the silicon nitride film 36 and the film thickness of the composite insulative film 38 expressed in terms of the film thickness of the oxide film. A reference numeral 51 indicates the relation between the thickness of the nitride film in the composite insulative film of the semiconductor device manufactured by the manufacturing method of this invention and the effective film thickness equivalent to the film thickness of the oxide film obtained by electrically evaluating the thickness of the composite insulative film. A reference numeral 52 indicates the relation between the thickness of the nitride film in the composite insulative film of the semiconductor device manufactured by the conventional manufacturing method and the film thickness of the composite insulative film equivalent to the film thickness of the oxide film.

It is understood from FIG. 13 that the film thickness of the composite insulative film of this invention expressed in terms of the film thickness of the oxide film can be made thinner than that of the conventional case by approx. 7 angstrom if the silicon nitride film of the same thickness is used. This is because the thermal nitride film having a large dielectric constant is used instead of the natural oxide film in this invention and the effective film thickness thereof equivalent to the film thickness of the oxide film can be increased. Therefore, the capacitor insulative film can be made thin and the capacitance can be increased by using the semiconductor device manufacturing method of this invention.

Figure 14:
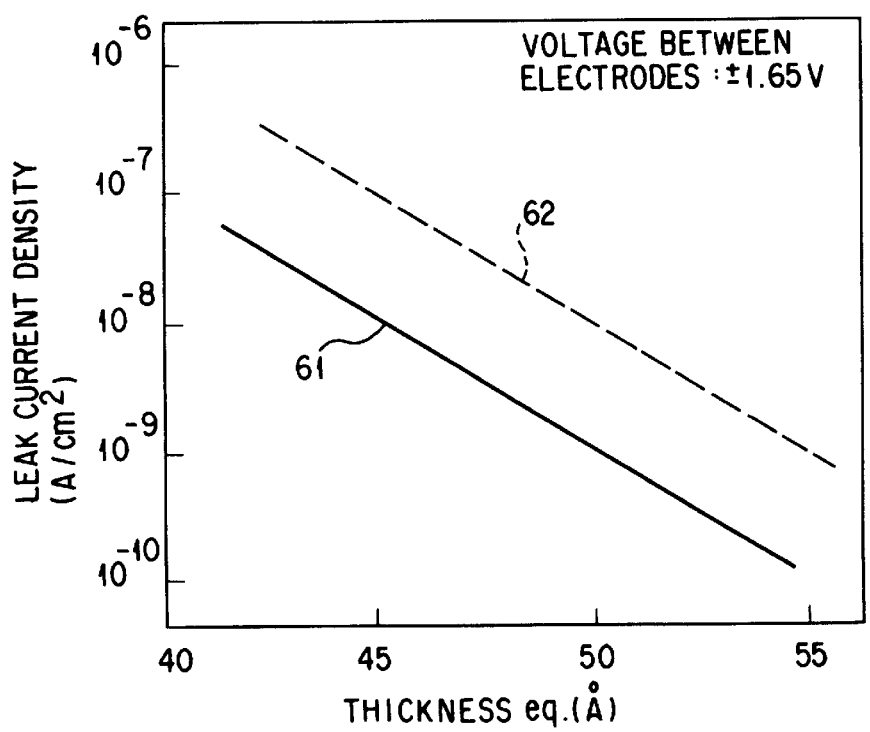
FIG. 14 is a graph showing the relation between the film thickness expressed in terms of the film thickness of the oxide film and the leak current density.

FIG. 14 shows the relation between the film thickness of the composite insulative film expressed in terms of the film thickness of the oxide film and the leak current density. A reference numeral 61 indicates the relation between the film thickness of the composite insulative film expressed in terms of the film thickness of the oxide film in the semiconductor device manufactured by the manufacturing method of this invention and the leak current in the composite insulative film obtained when a voltage of ±1.65 V is applied to the electrode of the semiconductor device. A reference numeral 62 indicates the relation between the film thickness of the composite insulative film expressed in terms of the film thickness of the oxide film in the semiconductor device manufactured by the conventional manufacturing method and the leak current in the composite insulative film obtained when a voltage of ±1.65 V is applied to the electrode of the semiconductor device.

It is understood from FIG. 14 that the leak current density can be made lower in the composite insulative film of this invention than in the composite insulative film of the conventional case when they are compared by use of the same film thickness equivalent to the film thickness of the oxide film. This is because the natural oxide film which permits a large amount of electrical leak is formed on the composite insulative film formed by the conventional manufacturing method, but no natural oxide film is formed on the composite insulative film formed by the manufacturing method of this invention. Therefore, by using the semiconductor device manufacturing method of this invention, the leak current density can be reduced in comparison with that in the conventional case and the dielectric strength and the reliability of the composite insulative film can be enhanced.

FIG. 15 shows the results of measurements of TDDB 50% MTTF obtained when a constant current of 1200 μA is passed in the composite insulative films manufactured by the manufacturing method of this invention and the conventional manufacturing method. In this case, it is assumed that the film thickness of the composite insulative film is set to 45 angstrom expressed in terms of the film thickness of the oxide film.

In FIG. 15, the conventional method A indicates the result of TDDB measurement for a semiconductor device obtained by forming a thermal nitride film on the electrode of the semiconductor wafer in the first furnace used for LPCVD method, moving the semiconductor wafer from the first furnace into the second furnace, and forming a CVD-SiN film formed on the thermal nitride film in the second furnace. This invention indicates the result of TDDB measurement for a semiconductor device obtained by forming a thermal nitride film on the semiconductor wafer in the first furnace and continuously forming a CVD-SiN film formed on the thermal nitride film in the first furnace. That is, this invention indicates the result of TDDB measurement for a semiconductor device manufactured by the manufacturing method according to the first embodiment. In FIG. 15, the conventional method B indicates the result of TDDB measurement for a semiconductor device manufactured by the conventional manufacturing method.

As is clearly seen from FIG. 15, when the thermal nitride film and CVD-SiN film are continuously formed in the same furnace without being exposed to the outer atmosphere as in this invention, the reliability which is approx. 50 times higher than that obtained by the conventional method can be attained.

FIG. 16 shows the result of measurement of the concentration of impurity or P contained in a polysilicon film formed as a lower electrode of each of the semiconductor devices manufactured by the manufacturing method of this invention and the conventional manufacturing method and the sheet resistance of the polysilicon film. A reference numeral 81 indicates the result of measurement of the sheet resistance of the polysilicon film. A reference numeral 82 indicates the result of measurement of the concentration of P contained in the polysilicon film.

In the conventional manufacturing method, a natural oxide film in the trench is removed by processing the semiconductor wafer in an atmosphere of reducing gas or by processing the semiconductor wafer in an atmosphere of inert gas in which the partial pressures of $H_2O$ and $O_2$ are set to be low after the semiconductor wafer is subjected to the cleaning process, and then a thermal nitride film is formed in the trench.

As is clearly seen from FIG. 16, in the conventional manufacturing method, impurity in the polysilicon film is extracted when the thermal nitride film is formed on the polysilicon film. On the other hand, in the manufacturing method of this invention, since $NH_3$ gas is introduced into the furnace from the time when the temperature of the semiconductor wafer is raised until the CVD-SiN film is formed, impurity in the polysilicon film will not be extracted. Also, a natural oxide film on the polysilicon film is removed and the thermal nitride film can be formed thereon at the same time.

Figure 17:
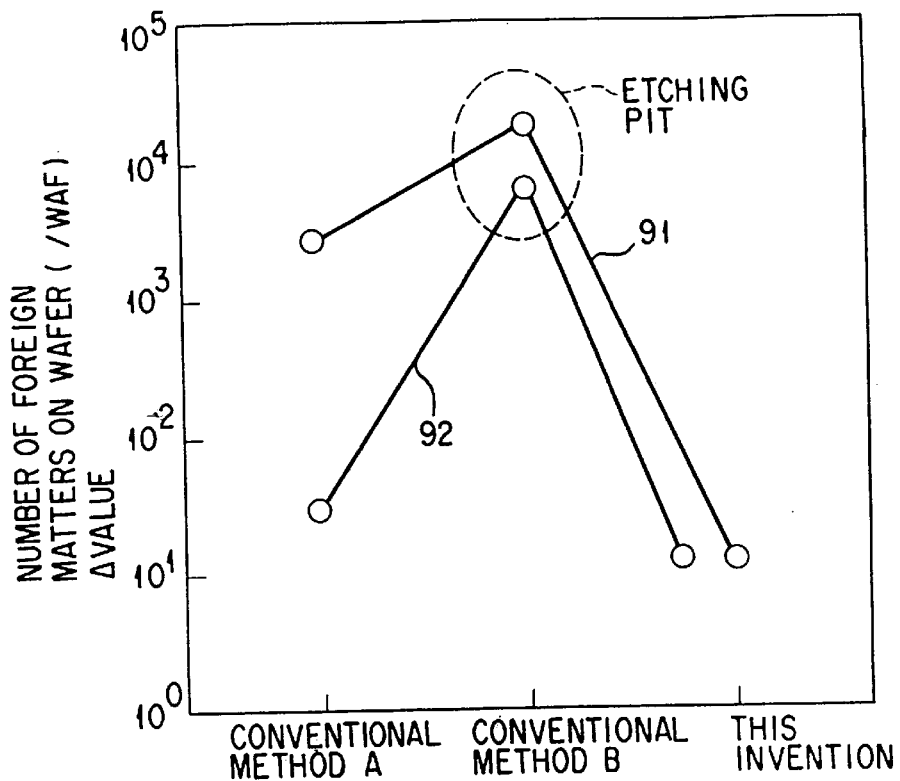
FIG. 17 is a graph showing the number of foreign matters on the wafer in a case where the semiconductor devices are manufactured by the manufacturing method of this invention and the conventional manufacturing method.
Figure 18:
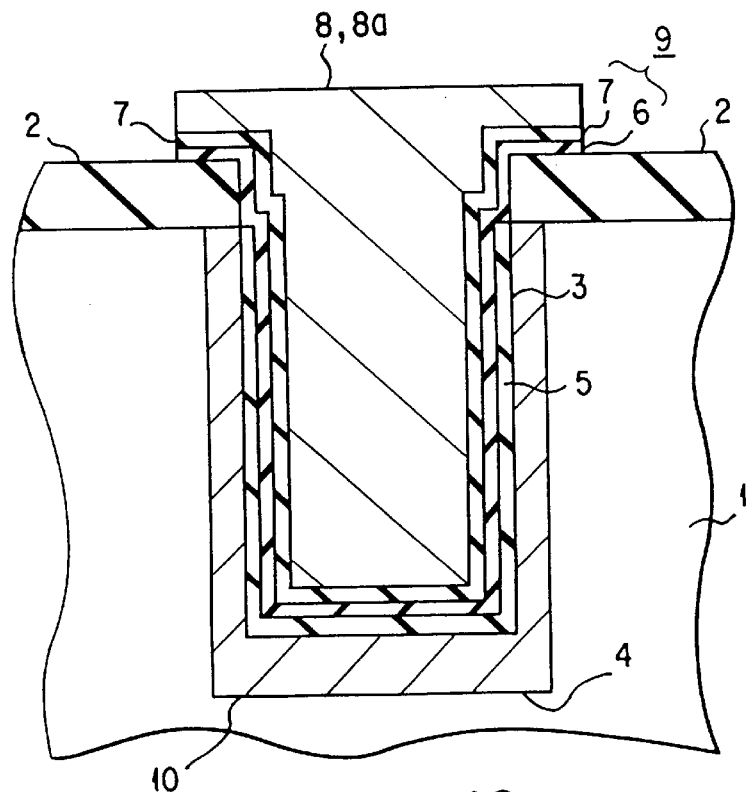
FIG. 18 is a cross sectional diagram showing a semiconductor device manufactured by the conventional manufacturing method.

FIG. 17 shows the number of foreign matters on the wafer in a case where the semiconductor devices are manufactured by the manufacturing method of this invention and the conventional manufacturing method. In FIG. 17, the conventional method A indicates the number of foreign matters on the wafer in a case where the CVD-SiN film is formed without removing the natural oxide film on the electrode surface of the semiconductor wafer. The conventional method B indicates the number of foreign matters on the wafer in a case where the natural oxide film on the electrode surface of the semiconductor wafer is removed in an atmosphere of inert gas, a thermal nitride film is formed on the electrode surface by $NH_3$ gas, and then the CVD-SiN film is formed. Further, this invention in FIG. 17 indicates the number of foreign matters on the wafer in a case where the CVD-SiN film is formed by the method of the first embodiment. A reference numeral 91 indicates the number of foreign matters with a diameter of 0.1 to 0.2 $\mu$m and a reference numeral 92 indicates the number of foreign matters with a diameter of 0.2 $\mu$m or more.

According to the case of FIG. 17, in the manufacturing method of the first embodiment, the above process can be effected without increasing the number of foreign matters with a diameter of 0.1 $\mu$m or more. Moreover, no etching pits are formed.

The embodiment in which this invention is applied to the capacitor of trench structure is explained, but this invention is not limited to this case, and it is possible to apply this invention to a capacitor with stack structure. Also, the position where the thermal nitride film is formed is not limited to the surface of the semiconductor substrate. The thermal nitride film may be formed on the semiconductor layer formed on the semiconductor substrate.

Further, the above embodiments in which this invention is applied to the capacitor are explained, but this invention is not limited to this case, and it is possible to apply this invention to an oxidation-resistant mask for LOCOS. That is, the mask for LOCOS can be formed by continuously forming the thermal nitride film and CVD-silicon nitride film on the semiconductor substrate by the above method and patterning the same. If the field oxidation is effected by use of this mask, occurrence of the birds beak in the field oxide film can be prevented.

Further, this invention is not limited to the semiconductor device using silicon but can be applied to a semiconductor device using GaAs.

What is claimed is:

1. A semiconductor device manufacturing method, comprising:

a first step of removing a natural oxide film from a semiconductor silicon substrate while forming a thermal nitride film on said semiconductor silicon substrate using an LPCVD method, the concentration of oxygen contained in said thermal nitride film being approximately $0.8 \times 10^{15}$ (atoms/cm$^2$) or less; and a second step of forming a nitride film on said thermal nitride film using an LPCVD method, wherein said substrate is kept in an $NH_3$ atmosphere at a temperature of 800° C. to 1200° C. for 120 minutes during said first step.

2. A method according to claim 1, wherein said first step is effected in an atmosphere of ammonia gas created by introducing ammonia gas into a furnace.

3. A method according to claim 1, wherein said first and second steps are continuously effected in an LPCVD furnace.

4. A method according to claim 1, wherein partial pressures Pr of $H_2O$ and $O_2$ in an LPCVD furnace in said first step are less than $S \times e^{(E \cdot C/T)}$ (Torr), where S is the inclination ($1 \times 10^8$ to $1 \times 10^9$), E is the active energy (−2.5 to −3.5), C is the coefficient for transferring Joule/mol to eV (11605), and T is the absolute temperature.

5. A method according to claim 1, wherein partial pressures Pr of $H_2O$ and $O_2$ in an LPCVD furnace in said first step are $1 \times 10^4$ Torr when a temperature of said semiconductor substrate is set to 850° C.

6. A method according to claim 1, wherein said natural oxide film on said semiconductor silicon substrate is removed by vaporizing the same in said first step.

7. A method according to claim 1, further comprising:

a fourth step of forming an oxide film on said nitride film; and a fifth step of forming an electrode on said oxide film.

8. A semiconductor device manufacturing method, comprising:

a first step of removing a natural oxide film from a substrate while forming a thermal nitride film on said substrate using an LPCVD method by setting partial pressures Pr of $H_2O$ and $O_2$ in an atmosphere of ammonia gas containing $H_2O$ and $O_2$ to $S \times e^{(E \cdot C/T)}$ (Torr), where S is the inclination ($1 \times 10^8$ to $1 \times 10^9$), E is the active energy (−2.5 to −3.5), C is the coefficient for transferring Joule/mol to eV (11605), and T is the absolute temperature; and a second step of forming a nitride film on said thermal nitride film by an LPCVD method, wherein an incubation time is less than one minute when the nitride film is formed on said thermal nitride film, wherein said substrate is kept at a temperature of 800° C. for 120 minutes during the first step.

9. A method according to claim 8, wherein said first and second steps are continuously effected in an LPCVD furnace.

10. A method according to claim 8, wherein said natural oxide film on said substrate is removed by vaporizing the same in said first step.

11. A method according to claim 8, further comprising:

a third step of forming an oxide film on said nitride film; and a fourth step of forming an electrode on said oxide film.

12. A semiconductor device manufacturing method, comprising:

a first step of cleaning a semiconductor substrate doped with impurity, said semiconductor substrate having a trench on which a natural oxide film is formed;

a second step of inserting said semiconductor substrate into a furnace of an LPCVD system, raising the temperature of an atmosphere in the furnace to remove said natural oxide film on said semiconductor substrate while forming a thermal nitride film directly on said semiconductor substrate, wherein the concentration of oxygen contained in said thermal nitride film is approximately $0.8 \times 10^{15}$ (atoms/cm$^2$) or less and, wherein said semiconductor substrate is kept at a temperature of 800° C. to 1200° C. for 120 minutes during the formation of said thermal nitride film;

a third step of forming a silicon nitride film on said thermal nitride film in the furnace of the LPCVD system, wherein an incubation time is less than one minute when the nitride film is formed on said thermal nitride film; and a fourth step of forming a silicon oxide film on said silicon nitride film.

13. A semiconductor device manufacturing method, comprising the steps of:

exposing a silicon substrate in an atmosphere of $NH_3$ at a temperature of 800° C. to 1200° C. for 120 minutes to remove a natural oxide film from said substrate while forming a thermal nitride film on said silicon substrate; and forming a nitride film on said thermal nitride film by an LPCVD method in an atmosphere of $NH_3$ at a temperature of 600° C. to 750° C., wherein an incubation time is less than one minute when the nitride film is formed on said thermal nitride film.

14. A semiconductor device batch treatment manufacturing method for processing a plurality of semiconductor substrates at one time, the method comprising the steps of:

loading the semiconductor substrates into a furnace set at a temperature of less than 600° C. while introducing an inert gas into the furnace of an LPCVD system, each of the semiconductor substrates having an impurity diffusion layer and a natural oxide film formed thereon;

discharging the inert gas from the furnace while setting partial pressures of $H_2O$ and $O_2$ remaining in the furnace to $1 \times 10^{-4}$ Torr or less;

introducing $NH_3$ gas into the furnace of the LPCVD system and raising the temperature of the semiconductor substrates to between 800° C. and 1200° C. for 120 minutes to remove said natural oxide films from the substrates while forming a thermal nitride film on each of the semiconductor substrates; and forming a nitride film on each of the thermal nitride films in the furnace of the LPCVD system in an atmosphere of $NH_3$ at a temperature of 600° C. to 750° C., wherein an incubation time is less than one minute when the nitride film is formed on said thermal nitride film.

15. A semiconductor device batch treatment manufacturing method for processing a plurality of semiconductor substrates at one time, the method comprising the steps of:

loading the semiconductor substrates into a furnace set at a temperature of less than 600° C., while introducing an inert gas into the furnace of an LPCVD system, each of the semiconductor substrates having trenches, and a natural oxide film being formed on an inner surface of each of the trenches;

discharging the inert gas from the furnace of the LPCVD system while setting partial pressures of $H_2O$ and $O_2$ remaining in the furnace to $1 \times 10^{-4}$ Torr or less, the partial pressures being set less than a total pressure;

introducing $NH_3$ gas into the furnace of the LPCVD system and raising the temperature of the semiconductor substrates to between 800° C. and 1200° C. for 120 minutes to remove said natural oxide film from the inner surface of each of the trenches while forming a thermal nitride film on the inner surface of each of the trenches, the concentration of oxygen contained in said thermal nitride film being approximately $0.8 \times 10^{15}$ (atoms/cm$^2$) or less; and forming a nitride film on each of the thermal nitride films in the furnace of the LPCVD system in an atmosphere of $NH_3$ at a temperature of 600° C. to 750° C., wherein an incubation time is less than one minute when the nitride film is formed on said thermal nitride film.

* * * * *

UNITED STATES PATENT AND TRADEMARK OFFICE
CERTIFICATE OF CORRECTION

PATENT NO.     : 6,171,977 B1
DATED          : January 9, 2001
INVENTOR(S)    : Yoshio KASAI et al Page 1 of 1

It is certified that error appears in the above-identified patent and that said Letters Patent is hereby corrected as shown below:

Claim 5,  Col. 12, line 63,  "$1 \times 10^4$ Torr" should read --$1 \times 10^{-4}$ Torr--.

Claim 7,  Col. 13, line 2,  "fourth" should read --third--.

Claim 7,  Col. 13, line 4,  "fifth" should read --fourth--.

Claim 15, Col. 14, line 43,  "$1 \times_{10}^{-4}$ Torr" should read --$1 \times 10^{-4}$ Torr--.

Signed and Sealed this

Fifth Day of June, 2001

Attest:

Attesting Officer

NICHOLAS P. GODICI
*Acting Director of the United States Patent and Trademark Office*